United States Patent
Thomason

(10) Patent No.: US 6,885,549 B2
(45) Date of Patent: Apr. 26, 2005

(54) SYSTEM AND METHOD FOR FLEXIBLE CIRCUITS

(75) Inventor: Gary S. Thomason, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 148 days.

(21) Appl. No.: 10/122,121

(22) Filed: Apr. 11, 2002

(65) Prior Publication Data

US 2003/0193772 A1 Oct. 16, 2003

(51) Int. Cl.⁷ .............................. G06F 1/16; H01P 3/00
(52) U.S. Cl. ...................... 361/683; 361/750; 361/794; 333/4; 333/238; 174/268
(58) Field of Search .............................. 361/679–683, 361/749–751, 780, 794; 333/1, 4, 5, 238, 246; 174/261, 268

(56) References Cited

U.S. PATENT DOCUMENTS

| | | | |
|---|---|---|---|
| 4,707,671 A | * 11/1987 | Suzuki et al. ................. 333/1 |
| 5,616,050 A | 4/1997 | Suski ......................... 439/495 |
| 5,715,139 A | 2/1998 | Nakajima ................... 361/683 |
| 6,091,601 A | * 7/2000 | Schlesener et al. ......... 361/681 |
| 6,101,088 A | 8/2000 | Nakajima et al. ........... 361/686 |
| 6,125,029 A | 9/2000 | Sasaki et al. ............... 361/681 |
| 6,175,504 B1 | 1/2001 | Hood, III et al. ........... 361/749 |
| 6,262,824 B1 | * 7/2001 | Sasaki et al. ............... 361/683 |
| 6,266,238 B1 | * 7/2001 | Paulsel et al. .............. 361/683 |
| 6,483,713 B2 | * 11/2002 | Samant et al. .............. 361/749 |

* cited by examiner

*Primary Examiner*—Lisa Lea-Edmonds
(74) *Attorney, Agent, or Firm*—Hamilton & Terrile, LLP; Robert W. Holland

(57) ABSTRACT

A flexible printed circuit improves data transfer rates by disposing ground wires in a ground plane proximate to signal wires disposed in a signal channel plane. One or more ground wires is associated with each signal wire pair or each signal wire for imaging of the return currents of the signal pairs. An overlapping alignment minimizes loop area between a ground wire and its associated signal wire. An offset alignment provides a reduced loop area and reduced breakage risk since movement of the flexible circuit does result in compression of the signal wire and its associated ground wire. A combination of overlapping and offset alignment balances signal transfer effectiveness with breakage risk by offsetting ground and signal wires is stress sensitive regions and overlapping ground and signal wires in stress tolerant regions. In one embodiment, the flexible circuit interfaces a portable computer with a display lid to support high-speed display signals with reduced breakage risk from cycling the display lid between an open and closed position.

7 Claims, 3 Drawing Sheets

SYSTEM AND METHOD FOR FLEXIBLE CIRCUITS

BACKGROUND OF THE INVENTION

1. Field of the Invention

The present invention relates in general to the field of electronic circuits, and more particularly to a system and method for flexible circuits, such as flexible circuits that interface a portable computer with a display lid.

2. Description of the Related Art

As the value and use of information continues to increase, individuals and businesses seek additional ways to process and store information. One option available to users is information handling systems. An information handling system generally process, compiles, stores and/or communicates information or data for business, personal or other purposes thereby allowing users to take advantage of the value of the information. Because technology and information handling needs and requirements vary between different users or applications, information handling systems may also vary regarding what information is handled, how the information is handled, how much information is processed, stored or communicated, and how quickly and efficiently the information may be processed, stored or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store and communicate information and may include one or more computer systems, data storage systems, and networking systems.

One difficulty that arises with information handling systems is the interfacing of components that move relative to each other. Flexible printed circuits are generally used for such interfaces and allow bending of the circuit by disposing signal wire lines in a flexible material. However, in order provide sufficient flexibility without excessive size, flexible printed circuits have reduced insulation resulting in problems transmitting signals without excessive electromagnetic interference emissions. For example, flexible printed circuits are often used to interface a portable computer display integrated in a lid with the main body of the portable computer. The use of a flexible printed circuit having sufficient flexibility allows repeated open and close cycles of the lid.

As portable computer designs have improved, the displays used by portable computers have achieved improved resolution, recently reaching resolutions of 1600×1200 with the UXGA and LVDS standards. However, the improved resolution has resulted in greater data transfer needs across flexible printed circuits, increasing the difficulty of transferring display signals without undue interference. For instance, display signal transfer rates have increased from the 65 MHz single channel rate of the XGA standard to the 54 MHz dual channel rate of the SXGA standard and the 80 MHz dual channel rate of the UXGA standard. This increase in display signal data transfer rates has presented a difficulty in accurate data transmission over sufficiently flexible circuits without breakage of wires in the flexible circuits from stress related to lid movement.

In order to obtain adequate signal transfer with sufficient flexibility, a variety of ground planes have been incorporated with flexible printed circuits. For instance, a silver ink, silver mesh or copper mesh imaging ground plane has been added to the flexible circuit, sometimes with randomly disposed wire lines, to reduce ground resistance and to reduce inductance generated by signal wires. However, flexible printed circuits remain susceptible to breakage due to dynamic bending and the ground planes have provided inadequate high-speed signal imaging. In addition, differences in resistance of ground plane material compared with signal resistance and interface resistance have left high inductance of the ground plane and large junction impedance in the ground plane transition into and out of the flexible circuits. The use of an inadequate ground plane results in excessive emissions and poor display signal data transfers, particularly as display data transfer rates have increased.

SUMMARY OF THE INVENTION

Therefore a need has arisen for a system and method which provides accurate high-speed data transfers through a flexible circuit.

A further need exists for a system and method which provide high-speed signal imaging and reduced inductance of a ground plane for a flexible circuit.

A further need has arisen for high-speed flexible circuits which remain reliable with repeated movement cycles.

In accordance with the present invention, a system and method are provided which substantially reduces the problems and difficulties associated with the transfer of data signals over a flexible circuit. Ground wires disposed in a ground plane of a flexible circuit are aligned with associated signal wires to reduce ground plane resistance and inductance, thus providing improved signal imaging on the ground plane.

More specifically, a flexible circuit includes plural signal wire traces forming signal wire pairs and disposed in a signal channel plane between first and second interfaces. A ground plane disposed in the flexible circuit proximate the signal plane aligns one or more ground wire traces with each signal wire pair for imaging the return currents of the differential signal pairs. The ground wires are aligned in an overlapping alignment to reduce loop area with their associated signal wires or in offset alignment to reduce wire breakage risk by avoiding compression of ground and signal wires during bending of the flexible circuit.

In one embodiment, the flexible circuit interfaces the computing section of a portable computer with a display, such as a liquid crystal display integrated in the lid of the portable computer. The flexible circuit supports opening and closing movement of the lid relative to the computing section while maintaining an interface to transfer display signals from the computing section to the display. Lid movement introduces stress from bending to the flexible circuit which has a greater impact in stress sensitive regions of the flexible circuit and a lesser impact in stress tolerant regions of the flexible circuit. The ground wires are disposed in the ground plane in offset alignment in stress sensitive regions to reduce breakage risk while still providing imaging for return currents of their associated signal wire, and are transitioned to an overlapping alignment in stress tolerant regions to minimize loop area where breakage risk is reduced. One or more ground wires may be associated with each signal wire pair or each individual signal wire.

The present invention provides a number of important technical advantages. One example of an important technical advantage is that accurate high-speed data transfers are provided through a flexible circuit by associating one or more ground wires of a ground plane with each signal wire pair of a signal channel plane. The proximate location of a ground wire to a signal wire reduces loop area and ground resistance, resulting in improved data transfer with reduced emissions. Overlapping alignment of a ground wire with each signal wire minimizes loop area. Offset alignment of a ground wire with each signal wire reduces breakage risk. A combination of overlapping and offset alignment trades off increased loop area for reduced breakage risk in stress sensitive versus stress tolerant regions of the flexible circuit.

Another example of an important technical advantage is that a flexible circuit according to the present invention may be used to interface a portable computer display integrated in a lid with a computing section to transfer display signals across a hinged physical connection. The flexible circuit allows movement of the lid relative to the computing section so that a user may repeatedly cycle the lid between a closed and open position. Offset alignment of ground wires with their associated signal wire pairs reduces breakage risk in stress sensitive regions of the flexible circuit and allows the use of more rigid but better conducting material for ground traces, such as copper wire traces. Overlapping alignment is stress tolerant regions minimizes loop area to provide optimal data signal transfers at high speeds associated with high resolution displays.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Preferred embodiments of the present invention are illustrated in the figures, like numerals being used referred to like and corresponding parts of the various drawings.

The present invention aids the transfer of data at high rates through flexible circuit signal wires by providing a ground plane with reduced inductance, resistance and impedance for an improved return path for imaging the return currents of the signal wires. Flexible circuits find uses in a variety of information handling systems where signals are sent between components that move relative to each other, such as components coupled with one or more hinges. For purposes of this disclosure, an information handling system may include any instrumentality or aggregate of instrumentalities operable to compute, classify, process, transmit, receive, retrieve, originate, switch, store, display, manifest, detect, record, reproduce, handle or utilize any form of information, intelligence, or data for business, scientific, control or other purposes. For example, an information handling system may be a personal computer, a network storage device, or any other suitable device and may vary in size, shape, performance, functionality and price. The information handling system may include random access memory (RAM), one or more processing resources such as a CPU, or hardware or software control logic, ROM and/or other types of nonvolatile memory. Additional components of the information handling system may include one or more disk drives, one or more network ports for communicating with external devices as well as various input and output (I/O) devices, such as a keyboard, a mouse and a video display. The information handling system may include one or more buses operable to transmit communications between the various hardware components.

Figure 1:
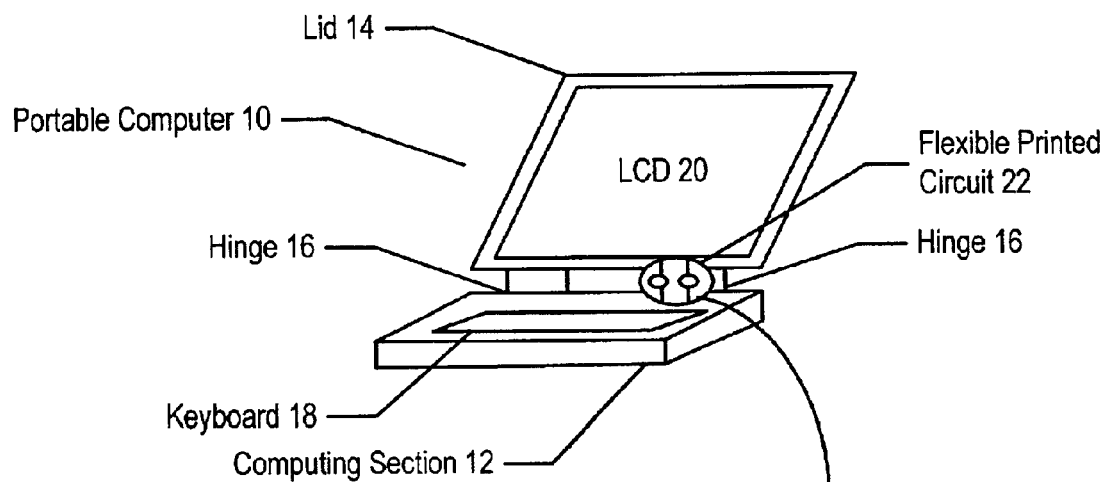
FIG. 1 depicts a portable computer having a flexible circuit interface between its computing section and its display lid.

Referring now to FIG. 1, an example of a commonly used flexible printed circuit is depicted installed in a portable computer 10, also referred to as a laptop computer. A computing section 12 is coupled to a lid 14 by one or more hinges 16. Computing section 12 supports a keyboard 18 or other input/output devices to communicate commands from a user to portable computer 10's CPU and to software operating on the CPU. A liquid crystal display (LCD) 20 is incorporated in lid 14 to display information to a user when lid 14 is rotated to an open position about hinges 16 to make LCD 20 visible. When portable computer 10 is powered down and not in use, lid 14 rotates about hinges 16 to a closed position that makes portable computer 10 easier to transport and less susceptible to breaking. A flexible printed circuit 22 interfaces computing section 12 and LCD 20 to transmit display signals for communicating information to a user through LCD 20. Flexible printed circuit 22 maintains the interface by flexing with the movement of lid 14 relative to computing section 12 so that signal wires running through flexible printed circuit 22 do not break even with repeated opening and closing cycles.

Figure 1A:
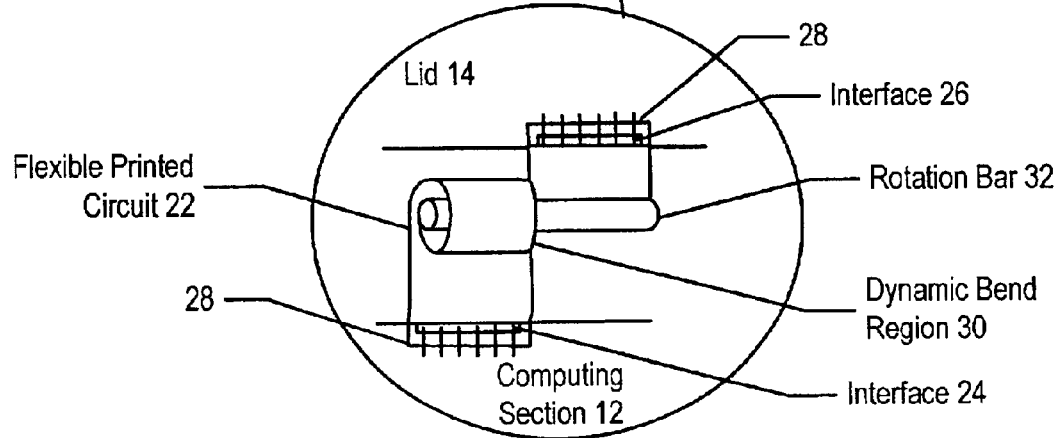
FIG. 1A depicts a blow-up view of the flexible circuit interface.

Referring now to FIG. 1A, a blow-up of flexible circuit 22 is depicted installed to communicate display signals between computing section 12 and lid 14 of portable computer 10. A computing section interface 24 and a lid interface 26 accept wires 28 that run through flexible printed circuit 22 to communicate display signals. A dynamic bend region 30 of flexible printed circuit 22 is rolled about a rotation bar 32 to handle the stress of movement between computing section 12 and lid 14 during opening and closing movements. Dynamic bend region 30 flexes to absorb stress from movement so that wires 28 do not break.

Figure 2:
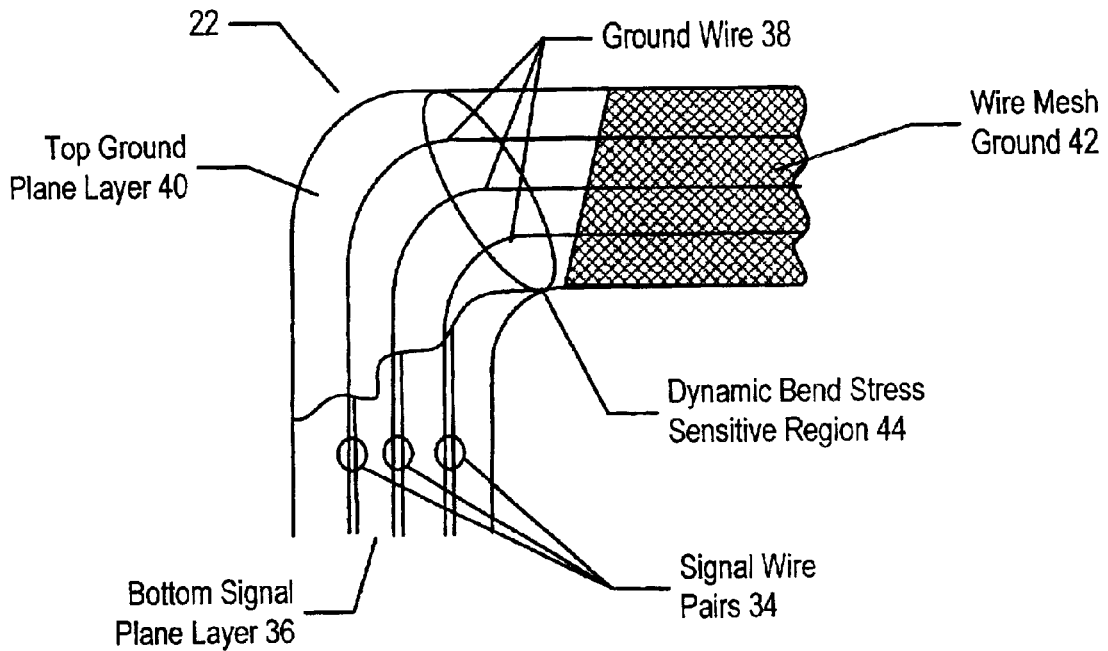
FIG. 2 depicts a cutaway view of a dynamic bend region of a flexible circuit having a ground plane with ground wires in parallel alignment with signal wire pairs.

Referring now to FIG. 2, a cutaway view of flexible printed circuit 22 depicts the arrangement of signal wires and ground wires in different plane layers. Signal wire traces support display signals as differential wire pairs 34 disposed in a signal plane layer as the bottom plane of flexible printed circuit 22. Ground wires traces support imaging of return currents for differential signal wire pairs 34 by having one or more ground wires 38 disposed in a ground plane layer 40 on top of the signal plane layer 36. Each ground wire 38 is associated with either a signal wire pair 34 or one of the signal wires of a pair to provide reduced impedance for the return path by reducing the loop area between the signal wire and its associated ground wire. The use of copper wire traces for signal wires 34 and ground wires 38 generally provide a suitable transmission path with reduced resistance relative to other materials. In addition, a silver ink, silver wire mesh or copper wire mesh disposed in ground plane layer 40 may improve conductance of ground imaging signals by providing electrical flow between ground wires.

The association of one or more ground wires 38 with each signal wire pair 34 provides imaging of the return currents of the signal wire pairs 34 to allow improved data transfer rates. Routing ground wires 38 in direct proximity to their associated signal wire pair 34 or individual signal wire reduces the loop area and the inductance between the display signal and ground signal. Thus, overlapping of the path of each ground wire 38 with the path of its associated signal wire pair or individual signal wire generally provides optimal data transfer with minimized interference and emissions. However, an overlapping alignment of a ground wire 38 and signal wire 34 so that the path of the ground wire is directly over or under the path of the signal wire may introduce additional stress during flexing of the circuit, increasing the risk of wire breakage. For instance, during movement of lid 14 relative to computing section 12, certain regions of flexible printed circuit 22 bend or absorb greater amounts of stress than other regions. In a stress sensitive region 44, dynamic bending of overlapping signal and ground wires due to movement introduces greater stress as both wires are compressed to bend against each other. Breakage of either a signal or ground wire is of greater risk in such stress sensitive regions 44 and that risk increases with overlapping alignment. Stress sensitive regions 44 are identified, for instance, by stress tests, such as repeated opening and closing cycles, or by observing the regions of flexible printed circuit 22 that have increased movement during opening and closing cycles.

Figure 3:
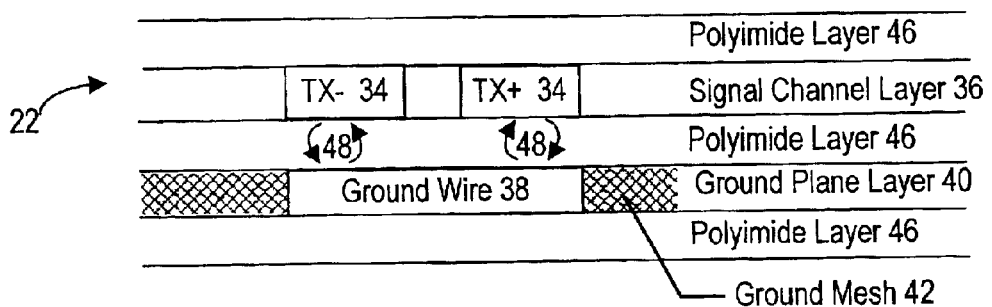
FIG. 3 depicts a side cutaway view of a flexible circuit having a single ground wire in overlapping alignment with a signal wire pair.
Figure 4:
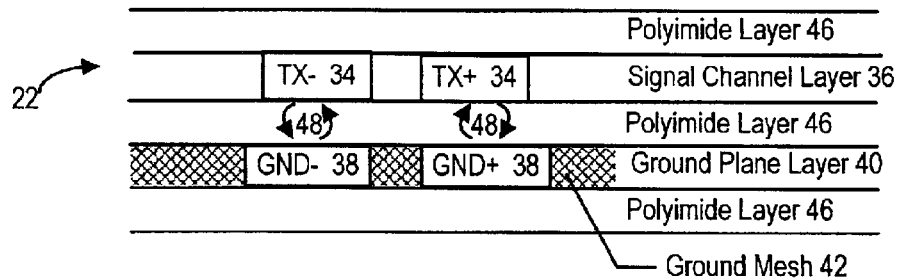
FIG. 4 depicts a side cutaway view of a flexible circuit having a ground wire in overlapping alignment with each signal wire.
Figure 5:
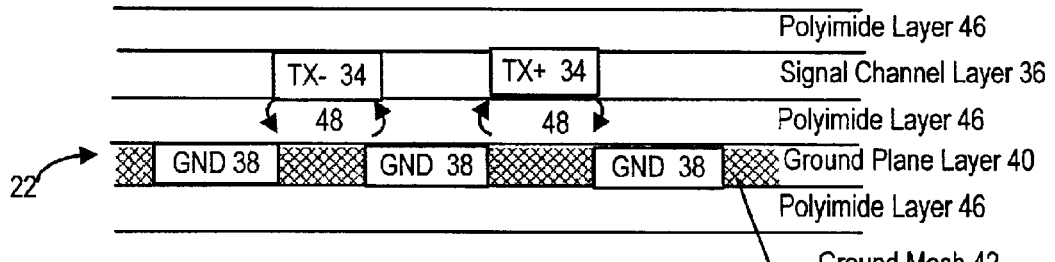
FIG. 5 depicts a side cutaway view of a flexible circuit having plural ground wires in offset alignment with a signal wire pair.

Data transfer rates are improved by running ground and signal wire traces in close proximity to reduce inductance loop area, however an offset alignment reduces the risk of wire breakage by reducing the stress created during bending as overlapping wires leverage against each other. Referring now to FIGS. 3, 4 and 5, a side cutaway view of different embodiments of flexible printed circuit 22 illustrates the trade off between loop area and breakage risk by the use of overlapping and offset alignment of ground and signal wires. Signal channel layer 36 and ground plane layer 40 have copper wire traces running parallel with each other between computing section interface 24 and lid section interface 26. Signal channel layer 36 and ground channel layer 40 are separated from each other by insulating flexible polyamid layers 46. A silver or copper mesh layer 42 is disposed in ground plane layer 40 to reduce resistance of the ground.

FIG. 3 depicts a single ground wire trace 38 associated with a signal wire pair 34 and arranged in overlapping alignment so that so that signal wire pair 34 runs parallel with and over the top of ground wire 38. The overlapping alignment of signal wire pair 34 and ground wire 38 provide a minimal loop area 48, resulting in an improved image of the return currents of the differential signal wire pair 34. However, if flexible printed circuit 22 is bent resulting in compression of signal wire pair 34 and ground wire 38, an increased risk of breakage of one or both of the signal wires 34 is created as they press against ground wire 38.

FIG. 4 depicts an alternative embodiment of flexible printed circuit 22 in which each signal wire of signal wire pair has an associated ground wire disposed in overlapping alignment. Loop area 48 remains small and the smaller ground wires 38 have reduced rigidity resulting in reduced stress during bending of the circuit. However, overlapping alignment of individual signal and ground trace paths may still increase the risk of breakage of either a ground or signal wire when bending of flexible printed circuit 22 compresses signal channel layer 36 and ground plane layer 40 against each other.

In another embodiment, depicted by FIG. 5, ground and signal wires run parallel with each other in an offset alignment so that one or more ground wires 38 are associated with each signal wire of a signal wire pair 34 without having overlapping paths. Offset alignment may increase loop area 48, increasing inductance somewhat, but reduces breakage risk since compression of signal channel plane layer 36 and ground plane layer 40 due to bending will not force signal wires and ground wires to press directly against each other.

Figure 6:
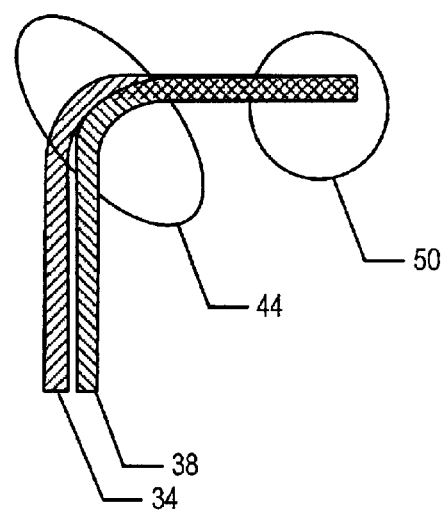
FIG. 6 depicts an overhead view of a signal wire and ground wire transitioning from an offset alignment in a stress sensitive region to an overlapping alignment in a stress tolerant region.

In another embodiment, a trade off between the advantages and disadvantages of overlapping and offset alignment is accomplished by identifying stress sensitive 20 regions 44 of the dynamic bend areas of a flexible printed circuit. For instance, the region of flexible printed circuit 22 proximate to computing section interface 24 tends to absorb a greater degree of stress associated with open and close cycles and thus has greater susceptibility to breakage of wires. Referring now to FIG. 6, a combination of offset and overlapping alignment of a signal and ground wire is depicted which trades off loop area for reliability by identifying a stress sensitive region 44 and a stress tolerant region 50. In stress sensitive region 44, offset alignment of signal wire 34 and ground wire 38 provides reduced risk of breakage by accepting a slight increase in loop area. As the paths of signal wire 34 and ground wire 38 proceed from stress sensitive region 44 to stress tolerant region 50, the offset alignment is transitioned to overlapping alignment to reduce loop area while maintaining an acceptable breakage risk. The combination of offset and overlapping alignment thus provide improved reliability in both signal transfer and maintaining wire continuity with repeated movement cycles.

Although the present invention has been described in detail, it should be understood that various changes, substitutions and alterations can be made hereto without departing from the spirit and scope of the invention as defined by the appended claims.

What is claimed is:

1. An information handling system comprising:
   a computing section having components operable to generate display signals for displaying information;
   a display device operable to display information from the display signals generated by the computing section; and
   a flexible circuit operable to interface the computing section and the display device to communicate the display signals from the computing section to the display device, the flexible circuit having a signal channel layer with plural display signal wire pairs configured to transmit the display signals, the flexible circuit further having a ground plane layer with at least one ground wire associated with each of the plural display signal wire pairs
   wherein the flexible circuit has one or more stress sensitive regions, each of the at least one around wire running in offset alignment with its associated display signal wire pair in the stress sensitive regions; and
   wherein the flexible circuit has one or more stress tolerant regions and wherein each of the at least one pound wire runs in overlapping alignment with its associated display signal wire pair in the stress tolerant regions.

2. The information handling system of claim 1 wherein the computing section composes a portable computer having a computing section and a lid flexibly coupled to the computing section, the display device composing a liquid crystal display integrated with the lid.

3. The information handling system of claim 1 wherein the flexible of circuit ground plane comprises one ground wire associated with each display signal wire pair.

4. The information handling system of claim 1 wherein the flexible circuit ground plane comprises one Found wire associated with each display signal wire.

5. A flexible printed circuit for transmitting signals, the flexible printed circuit comprising:

first and second interfaces;

a signal plane having plural signal wires running between the first and second interfaces;

a ground plane having at least one ground wire associated with each pair of signal wires and running between the first and second interfaces, each ground wire aligned with its associated signal wires; and a stress sensitive region, each ground wire in offset alignment with its associated signal wires in the stress sensitive region.

6. The flexible printed circuit of claim 5 wherein:

the first interface is operable to communicate with a portable computer; and the second interface is operable to communicate with a display, the display coupled to the portable computer by a hinge.

7. The flexible printed circuit of claim 5 wherein each ground wire is in overlapping alignment with its associated signal wires outside of the stress sensitive region.

* * * * *